(12) United States Patent
Kao et al.

(10) Patent No.: US 9,004,006 B2
(45) Date of Patent: Apr. 14, 2015

(54) PROCESS CHAMBER LID DESIGN WITH BUILT-IN PLASMA SOURCE FOR SHORT LIFETIME SPECIES

(75) Inventors: Chien-Teh Kao, Sunnyvale, CA (US); Hyman W. H. Lam, San Jose, CA (US); Mei Chang, Saratoga, CA (US); David T. Or, Santa Clara, CA (US); Nicholas R. Denny, Santa Clara, CA (US); Xiaoxiong Yuan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 538 days.

(21) Appl. No.: 13/095,720

(22) Filed: Apr. 27, 2011

(65) Prior Publication Data

US 2011/0265721 A1 Nov. 3, 2011

Related U.S. Application Data

(60) Provisional application No. 61/328,971, filed on Apr. 28, 2010.

(51) Int. Cl.
| | |
|---|---|
| C23C 16/00 | (2006.01) |
| C23C 16/455 | (2006.01) |
| C23C 16/505 | (2006.01) |
| H01J 37/32 | (2006.01) |

(52) U.S. Cl.
CPC ..... *C23C 16/45536* (2013.01); *C23C 16/45565* (2013.01); *C23C 16/505* (2013.01); *H01J 37/32091* (2013.01); *H01J 37/3244* (2013.01)

(58) Field of Classification Search
USPC .......................................... 118/723 ER, 715
See application file for complete search history.

(56) References Cited

U.S. PATENT DOCUMENTS

| | | | | |
|---|---|---|---|---|
| 5,614,026 | A | * | 3/1997 | Williams ............... 118/723 ME |
| 6,435,428 | B2 | * | 8/2002 | Kim et al. ...................... 239/553 |
| 6,886,491 | B2 | * | 5/2005 | Kim et al. ................. 118/723 E |
| 6,998,014 | B2 | * | 2/2006 | Chen et al. ............... 156/345.34 |
| 7,396,480 | B2 | | 7/2008 | Kao et al. |
| 7,658,799 | B2 | * | 2/2010 | Ishikawa ........................ 118/715 |
| 2002/0000202 | A1 | * | 1/2002 | Yuda et al. ............. 118/723 ER |
| 2003/0143328 | A1 | * | 7/2003 | Chen et al. ................ 427/255.28 |
| 2004/0216844 | A1 | | 11/2004 | Janakiraman et al. |
| 2005/0217576 | A1 | * | 10/2005 | Ishibashi et al. .............. 118/715 |
| 2007/0119370 | A1 | | 5/2007 | Ma et al. |
| 2007/0119371 | A1 | | 5/2007 | Ma et al. |

(Continued)

OTHER PUBLICATIONS

International Search Report and Written Opinin dated Jan. 6, 2012 for International Application No. PCT/US2011/034147.

*Primary Examiner* — Sylvia R MacArthur
*Assistant Examiner* — Anna Crowell
(74) *Attorney, Agent, or Firm* — Patterson & Sheridan, LLP

(57) ABSTRACT

An apparatus and a method for depositing materials, and more particularly a vapor deposition chamber configured to deposit a material during a plasma-enhanced process are provided. In one embodiment a chamber comprises a chamber body defining a process volume, a substrate support disposed in the process volume and configured to support one or more substrates, a process lid assembly disposed over the substrate support, wherein the process lid assembly has a plasma cavity configured to generate a plasma and provide one or more radical species to the process volume, a RF (radio frequency) power source coupled to the gas distribution assembly, a plasma forming gas source coupled with the process lid assembly, and a reactant gas source coupled with the process lid assembly.

18 Claims, 4 Drawing Sheets

(56) References Cited

U.S. PATENT DOCUMENTS

| | | | |
|---|---|---|---|
| 2007/0193515 A1* | 8/2007 | Jeon et al. | 118/723 IR |
| 2009/0095334 A1 | 4/2009 | Huston | |
| 2009/0133838 A1* | 5/2009 | Miyagawa | 156/345.35 |
| 2009/0139453 A1 | 6/2009 | Chen et al. | |
| 2009/0151636 A1* | 6/2009 | White et al. | 118/723 ME |
| 2010/0003406 A1 | 1/2010 | Lam et al. | |
| 2010/0037822 A1* | 2/2010 | Ishibashi et al. | 118/723 E |
| 2010/0104771 A1 | 4/2010 | Kudela et al. | |

\* cited by examiner

PROCESS CHAMBER LID DESIGN WITH BUILT-IN PLASMA SOURCE FOR SHORT LIFETIME SPECIES

CROSS-REFERENCE TO RELATED APPLICATIONS

This application claims benefit of U.S. provisional patent application Ser. No. 61/328,971, filed Apr. 28, 2010, which is herein incorporated by reference in its entirety.

BACKGROUND

1. Field

Embodiments of the invention generally relate to an apparatus and a method for depositing materials, and more particularly to a vapor deposition chamber configured to deposit a material during a plasma-enhanced process.

2. Description of the Related Art

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 µm and aspect ratios of 10 or greater. Accordingly, conformal deposition of materials to form these devices is becoming increasingly important.

While conventional chemical vapor deposition (CVD) has proved successful for device geometries and aspect ratios down to 0.15 µm, the more aggressive device geometries require an alternative deposition technique. One technique that is receiving considerable attention is atomic layer deposition (ALD). During an ALD process, reactant gases are sequentially introduced into a deposition chamber containing a substrate. Generally, a first reactant is pulsed into the deposition chamber and is adsorbed onto the substrate surface. A second reactant is pulsed into the deposition chamber and reacts with the first reactant to form a deposited material. A purge process is typically carried out between the delivery of each reactant gas. The purge process may be a continuous purge with the carrier gas or a pulse purge between the delivery of the reactant gases. Thermally induced ALD processes are the most common ALD technique and use heat to cause the chemical reaction between the two reactants. While thermal ALD processes work well to deposit some materials, the processes often have a slow deposition rate. Therefore, fabrication throughput may be impacted to an unacceptable level. The deposition rate may be increased at a higher deposition temperature, but many chemical precursors, especially metal-organic compounds, decompose at elevated temperatures.

Plasma-enhanced CVD (PE-CVD) and plasma-enhanced ALD (PE-ALD) may be used to form various materials. In some examples of PE-ALD processes, a material may be formed from the same chemical precursors as a thermal ALD process, but at a higher deposition rate and a lower temperature. Although several variations of techniques exist, in general, a PE-ALD process provides that reactant gas and reactant plasma are sequentially introduced into a deposition chamber containing a substrate. The first reactant gas is pulsed into the deposition chamber and is adsorbed onto the substrate surface. Thereafter, the reactant plasma generally supplied by a plasma source is pulsed into the deposition chamber and reacts with the first reactant gas to form a deposited material. Similarly to a thermal ALD process, a purge process may be conducted between the delivery of each of the reactants. While PE-ALD processes overcome some of the shortcomings of thermal ALD processes due to the high degree of reactivity of the reactant radicals within the plasma, PE-ALD processes have many limitations. PE-ALD process may cause plasma damage to a substrate (e.g., etching), be incompatible with certain chemical precursors and may require additional hardware.

For any substrate manufacturing process that requires remote plasma to generate active reactant species, a separate remote plasma unit is generally employed with the process chamber. Although such an approach serves well to generate active reactant species away from the substrate without the risk of plasma damage to the devices by the reactant radicals, the amount of active species reaching the surface of the substrate is quite limited due to the fast recombination of the active species along the travel distance to the substrate. While it is possible to apply high plasma power to increase the amount of available active species, the high plasma power usually results in hardware damage to the plasma unit which exhibit as defect issues with high particle counts. In addition, available remote plasma source (RPS) units are typically designed such that maintenance of the units is difficult. The known viable method for servicing an RPS with high defectivity is to replace the unit. Since high power RPS units may require frequent replacement, this in turn contributes to increased system downtime and operating costs.

Therefore, there is a need for an apparatus and a process for depositing a material on a substrate by a vapor deposition technique, such as by a PE-ALD process.

SUMMARY

Embodiments of the invention generally relate to an apparatus and a method for depositing materials, and more particularly to a vapor deposition chamber, for example, a PE-CVD or PE-ALD chamber, configured to deposit a material during a plasma-enhanced process. In one embodiment a chamber for processing one or more substrates is provided. The chamber comprises a chamber body defining a process volume, a substrate support disposed in the process volume and configured to support one or more substrates, a process lid assembly disposed over the substrate support, wherein the process lid assembly has a plasma cavity configured to generate a plasma and provide one or more radical species to the process volume, a RF (radio frequency) power source coupled to the gas distribution assembly, a plasma forming gas source coupled with the process lid assembly, and a reactant gas source coupled with the process lid assembly.

In another embodiment a process lid assembly for providing radicals of a reactant gas to a process volume is provided. The process lid assembly comprises a first electrode having a plurality of first passages coupling a first surface of the first electrode and a second surface of the first electrode for delivering a plasma containing gas to a process volume, wherein the first surface of the first electrode faces the process volume and a plurality of second passages coupling the first surface of the first electrode with the second surface of the first electrode for delivering a reactant gas to the process volume, a second electrode substantially parallel to the first electrode having a plurality of third passages coupling a first surface of the second electrode and a second surface of the second electrode for delivering a plasma forming gas to a plasma cavity, wherein the plasma cavity is defined between the first electrode and the second electrode and the first surface of the second electrode faces the plasma cavity, and an insulator disposed between the first and second electrodes near perimeters of the first electrode and the second electrode, wherein the second electrode is adapted for coupling with an RF power source and the first electrode is adapted for coupling with ground.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to an apparatus and a method for depositing materials, and more particularly to a vapor deposition chamber configured to deposit a material during a plasma-enhanced process. In certain embodiments, a process chamber lid with a built-in plasma source for generating active reactant species adjacent to the process volume of a process chamber is provided. In certain embodiments, the process chamber lid assembly comprises multiple components that form a plasma cavity where the active reactant species are generated, with two separate pathways, each pathway for delivering each of a reaction gas or gases and a plasma to a process volume. The ability to generate plasma internally in the process lid assembly reduces the distance which the plasma activated species has to travel to reach the substrate surface in the process volume of a process chamber compared to systems using an RPS. The amount of available active species in the process volume is significantly increased and the required power to achieve the increase available active species is concurrently reduced.

Figure 1:
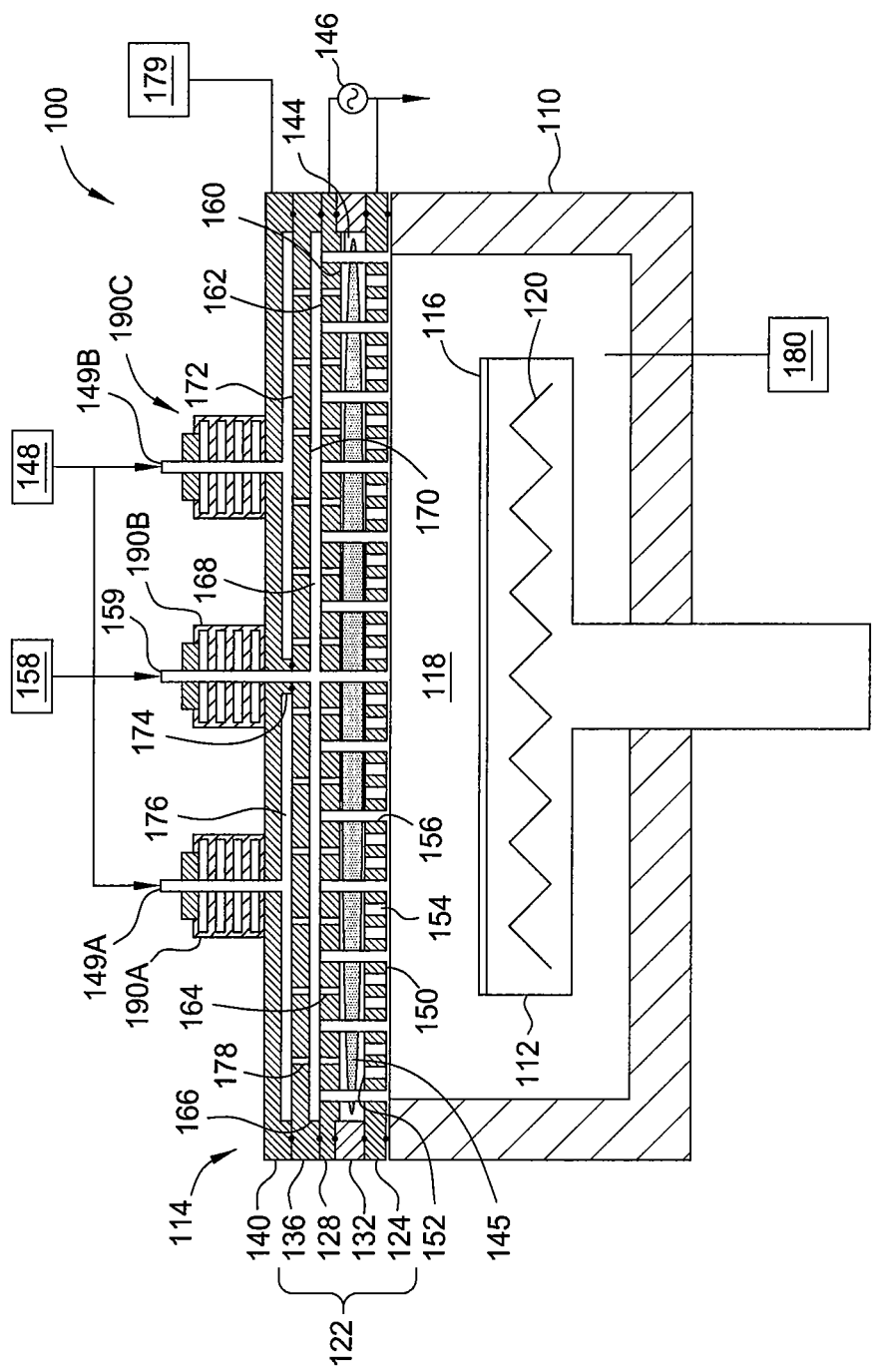
FIG. 1 is a schematic view of a process chamber having one embodiment of a process lid assembly in accordance with one embodiment of the present invention.

FIG. 1 is a schematic view of a process chamber 100 in accordance with one embodiment of the present invention. In one embodiment, the process chamber is adapted to form metal nitride films with at least one precursor generated from a plasma.

The process chamber 100 comprises a chamber body 110, a substrate support 112 disposed within the chamber body 110, and a process chamber lid assembly 114 disposed on the chamber body 110.

The substrate support 112 is configured to support one or more substrates 116 to expose the one or more substrates 116 to precursors in a process volume 118 defined by the chamber body 110 and the process lid assembly 114. In one embodiment, the substrate support 112 comprises a heater 120 adapted to heat the one or more substrates 116 to a temperature required by the process being performed.

The process lid assembly 114 comprises a showerhead assembly 122 with a water box 140 for providing temperature control of the process lid assembly 114 positioned on the showerhead assembly 122. The showerhead assembly 122 comprises a first electrode 124 which also functions as a lid plate, a second electrode 128 which functions as a plasma cavity RF electrode positioned substantially parallel to the first electrode 124, an insulator 132 positioned in between the first electrode 124 and the second electrode 128, and a blocker plate 136 positioned on the second electrode 128. The first electrode 124, the insulator 132, and the second electrode 128 define a plasma cavity 144 where a capacitive plasma 145 can be generated. In one embodiment, the first electrode 124 is coupled to a RF (radio frequency) ground, the second electrode 128 is coupled to a RF power source 146, and the insulator 132 electrically insulates the first electrode 124 from the second electrode 128.

A first gas source 148 is coupled with the plasma cavity 144 via gas inlets 149A, 149B for providing one or more plasma forming gases to the plasma cavity 144. The capacitive plasma 145 can be generated in the plasma cavity 144 when an RF power is applied to the second electrode 128. Other gases such as carrier gases and purge gases may be coupled with the plasma cavity for delivering plasma forming gases to the plasma cavity and purging the process chamber 100 of plasma forming gases.

The first electrode 124 comprises a first surface 150 or lower surface adjacent to the process volume 118 and a second surface 152 or upper surface adjacent to the plasma cavity 144 with a plurality of first passages 154 formed therebetween. The plurality of first passages 154 couples the process volume 118 with the plasma cavity 144 and provides a conduit for delivering active reactant species from the plasma cavity 144 to the process volume 118. The plurality of first passages 154 may also be used to deliver other gases such as carrier gases, purge gases, and/or cleaning gases to the process chamber 100. In one embodiment, the plurality of first passages 154 are evenly distributed across a surface area of the first electrode 124 corresponding to a surface area of the substrate support 112. The first electrode 124 also has a plurality of second passages 156 coupling the process volume 118 with a second gas source 158 via gas inlet 159 for supplying one or more precursors to the process volume 118. The plurality of second passages 156 may also be used to deliver other gases such as carrier gases, purge gases, and/or cleaning gases to the process chamber 100.

In one embodiment, the first electrode 124 may be formed from a conductive material, such as metal or metal alloys. In one embodiment, the first electrode 124 is a planar disk. In one embodiment, the first electrode 124 is formed from a metal. Exemplary metals may be selected from the group consisting of aluminum, steel, stainless steel (e.g., iron-chromium alloys optionally containing nickel), iron, nickel, chromium, an alloy thereof, and combinations thereof.

The second electrode 128 comprises a first surface 160 or lower surface adjacent to the plasma cavity 144 and a second surface 162 or upper surface opposing the first surface with a plurality of third passages 164 formed between the first surface 160 and the second surface 162 for providing one or more plasma forming gases from the first gas source 148 to the plasma cavity 144. The plurality of third passages 164 may also be used to deliver other gases such as carrier gases, purge gases, and/or cleaning gases to the process chamber 100. As shown in FIG. 1, the plurality of second passages 156 traverse the plasma cavity 144 extending through the first surface 160 of the second electrode 128 to the second surface 162 of the second electrode 128.

In one embodiment, the second electrode 128 may be formed from a conductive material, such as metal or metal alloys. In one embodiment, the second electrode 128 is formed from a metal. Exemplary metals may be selected from the group consisting of aluminum, steel, stainless steel (e.g., iron-chromium alloys optionally containing nickel), iron, nickel, chromium, an alloy thereof, and combinations thereof. In one embodiment, the second electrode 128 is a planar disk.

The insulator 132 provides electrical insulation between the first electrode 124 and the second electrode 128 and may be formed from an electrically insulating material. In one embodiment, the insulator 132 is formed from a ceramic material, fore example, aluminum nitride ($Al_xN_y$) or aluminum oxide ($Al_2O_3$).

The blocker plate 136 is disposed on the second electrode 128 and has a recessed portion 166 which forms a second gas region 168 defined by the recessed portion 166 and the second surface 162 of the second electrode 128. The second gas region 168 is positioned above and coupled with the process volume 118 via the plurality of second passages 156 for supplying the precursor gases to the process volume 118. The blocker plate 136 comprises a first surface 170 or lower surface and a second surface 172 or upper surface with the second gas region 168 defined between the first surface 170 of the blocker plate 136 and the second surface 162 of the second electrode 128. A plurality of fourth passages 178 for coupling the first surface 170 of the blocker plate 136 with the second surface 172 of the blocker plate 136 for coupling with the plurality of third passages 164 for delivering a plasma forming gas to the plasma cavity 144.

In one embodiment, one or more precursor gases from the second gas source 158 flows into the second gas region 168 via gas inlet 159 and through the plurality of second passages 156 and into the process volume 118 where they are delivered toward the surface of the one or more substrates 116. In one embodiment, the blocker plate 136 may comprise multiple plates which may be designed to aid in the uniform delivery of precursor gases to the process volume 118.

In one embodiment, the water box 140 is disposed on the blocker plate 136. The water box 140 may have a recessed portion 174 which forms a first gas region 176 defined by the recessed portion 174 and the second surface 172 of the blocker plate 136. The first gas region 176 is positioned above and coupled with the plasma cavity 144 via the plurality of third passages 164 for supplying the plasma forming gases to the plasma cavity. The plasma forming gas flows from the first gas source 148 to the first gas region 176 via gas inlets 149A, 149B where the plasma forming gas is distributed radially through the plurality of third passages 164 into the plasma cavity 144 where RF power is supplied to the second electrode 128 to form the capacitive plasma 145 in the plasma cavity 144. The activated radicals in the capacitive plasma 145 are then delivered to the process volume 118 via the plurality of first passages 154.

As shown in FIG. 1, the plurality of first passages 154 are offset (e.g., not having a "line of sight") from the plurality of third passages 164 which aids in the uniform distribution of activated species to the wafer surface. As discussed herein, in certain embodiments, it is desirable for the plurality of first passages 154 to be lined up with or in the line of sight with the plurality of third passages 164. "Line-of-sight" as used herein refers to a straight path or a substantially straight path between two points. The straight path or the substantially straight path may provide an unobstructed pathway or an unobscured pathway for a gas or a plasma to flow between at least two points. Generally, an obstructed pathway or an obscured pathway prohibits or substantially reduces the passage of a plasma while permitting the passage of a gas. Therefore, a line-of-sight pathway usually permits the passage of a gas or a plasma, while a pathway not having a line of sight between two points prohibits or substantially reduces the passage of a plasma and permits the passage of a gas.

The water box 140 is used to regulate the temperature of the process chamber 100 by removing heat from the process lid assembly, such as the process lid assembly 114. The water box 140 may be positioned on top of the showerhead assembly 122. The water box 140 removes heat from the process lid assembly 114, such as from showerhead assembly 122. During a deposition process, a fluid at an initial temperature is administered into the water box 140 through an inlet (not shown). The fluid absorbs heat while traveling along a passageway (not shown). The fluid at a higher temperature is removed from the water box 140 via an outlet (not shown). The water box 140 may contain or be formed from a metal such as aluminum, aluminum alloys (e.g., aluminum magnesium silicon alloys, such as aluminum 6061), aluminum-plated metals, stainless steel, nickel, nickel alloys (such as INCONEL® or HASTELLOY®), nickel-plated aluminum, nickel-plated metal, chromium, iron, alloys thereof, derivatives thereof, or combinations thereof. In one example, the water box 140 may contain or is formed from aluminum or an aluminum alloy.

The water box 140 may be connected to a fluid source 179 for supplying fluid to the water box 140 during the deposition process. The fluid may be in liquid, gas or supercritical state and is capable of adsorbing and dissipating heat in a timely manner. Liquids that may be used in the water box 140 include water, oil, alcohols, glycols, glycol ethers, other organic solvents, supercritical fluids (e.g., $CO_2$) derivatives thereof or mixtures thereof. Gases may include nitrogen, argon, air, hydrofluorocarbons (HFCs), or combinations thereof. Preferably, the water box 140 is supplied with water or a water/alcohol mixture.

The process chamber 100 further comprises a vacuum pump 180 configured to pump out the process volume 118 to obtain a desired pressure level in the process volume 118. During processing, the vacuum pump 180 provides a negative pressure in the process volume 118 relative to the plasma cavity 144, thus allowing the species in the plasma cavity 144 to flow to the process volume 118.

In certain embodiments, ferrite containing elements 190A, 190B, and 190C are positioned adjacent to at least one of the gas inlets 149A, 149B and 159. The ferrite containing elements 190A, 190B, and 190C may be positioned adjacent to the gas inlets 149A, 149B and 159 to reduce the formation of parasitic plasma or arcing near the gas inlets 149A, 149B and 159. The ferrite containing elements 190A, 190B, and 190C may form parallel ferrite boundaries that suppress RF currents perpendicular to the ferrite boundary and absorb magnetic field components parallel to the boundary.

The ferrite containing elements 190A, 190B, 190C may be formed from any material that can be used to provide a path through which the generated fields (e.g., magnetic fields), created by the flow of RF current within portions of the process chamber 100, will preferentially flow. In one example, the ferrite containing elements 190A, 190B, and 190C may be formed from or embedded with a ferrite material. Ferrite materials may include non-conductive ferromagnetic ceramic compounds derived from iron oxides such as hematite ($Fe_2O_3$) or magnetite ($Fe_3O_4$) as well as oxides of other metals. Ferrite materials may further contain nickel, zinc, and/or manganese compounds. Exemplary ferrite materials include manganese ferrites, manganese zinc ferrites, nickel zinc ferrites, and combinations thereof.

The ferrite containing elements 190A, 190B, and 190C may take the form of any shape that suppresses RF currents perpendicular to the ferrite boundary and absorb magnetic field components parallel to the boundary. Exemplary shapes for the ferrite containing elements 190A, 190B, and 190C include rings, toroids, and coils. In one exemplary embodiment, the gas inlet 149B is an aluminum tube and the ferrite containing element 190B contains a plurality of toroid or donut-shaped ferrite members containing nickel-zinc ferrites. In another exemplary embodiment, as shown in FIG. 1, the gas inlets 149A, 149B, and 159 are aluminum tubes, each aluminum tube surrounded by a respective ferrite containing element 190A, 190B, and 190Q containing a plurality of toroid or donut-shaped ferrite members that contain nickel-zinc ferrites.

Figure 2:
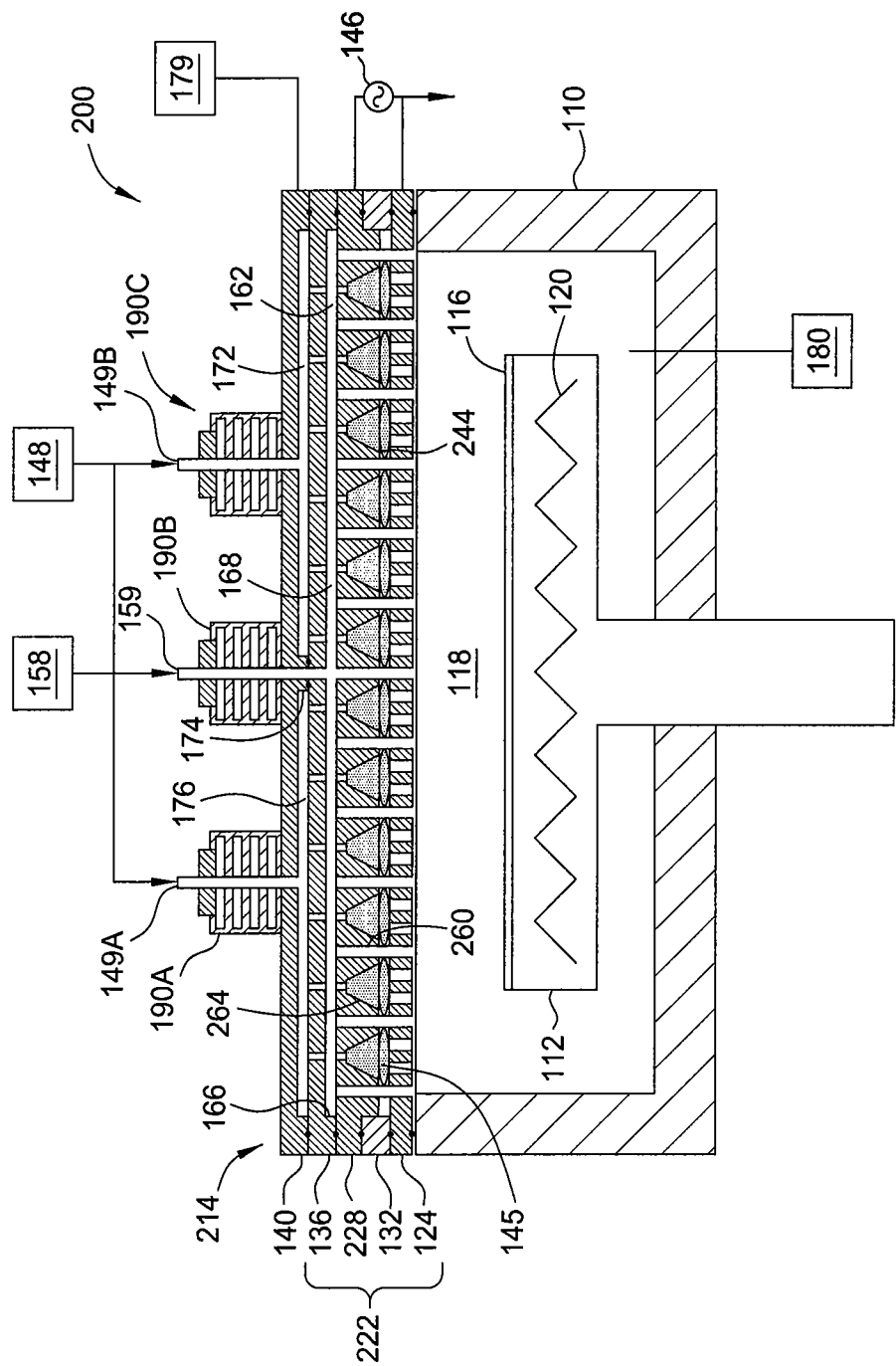
FIG. 2 is a schematic view of another process chamber having another embodiment of a process lid assembly in accordance with one embodiment of the present invention.

FIG. 2 is a schematic view of another process chamber 200 having another embodiment of a process lid assembly 214 in accordance with one embodiment of the present invention. The process chamber 200 is similar to process chamber 100 shown in FIG. 1 except that the second electrode 128 of process chamber 100 is replaced with second electrode 228 which has a plurality of multiple cone-shaped cavities 264. The cone-shaped cavities in combination with the variable distance between the first electrode 124 and the second electrode 228 allows for a wider plasma ignition window. Plasma can be effectively initiated in the cone-shaped cavities 264 and as a result, uniform plasma can be maintained across the entire plasma cavity in between the first electrode 124 and the second electrode 228.

The process lid assembly 214 comprises a showerhead assembly 222 with a water box 140 positioned on the showerhead assembly 222. The showerhead assembly 222 comprises the first electrode 124, a second electrode 228 positioned substantially parallel to the first electrode 124, the insulator 132 positioned in between the first electrode 124 and the second electrode 228, and the blocker plate 136 positioned on the second electrode 228. The first electrode 124, the insulator 132, and the second electrode 228 define a plasma cavity 244 where capacitive plasma may be generated. In one embodiment, the first electrode 124 is coupled to a RF (radio frequency) ground, the second electrode 228 is coupled to a RF power source 146, and the insulator 132 electrically insulates the first electrode 124 from the second electrode 228.

Figure 3C:
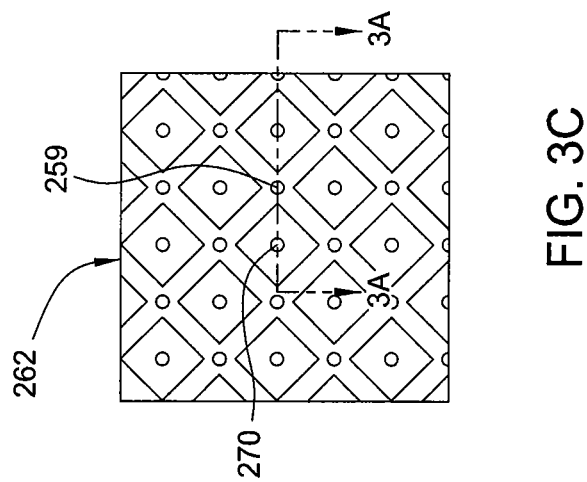
FIG. 3C is a top view of the electrode of FIG. 3A.
Figure 3A:
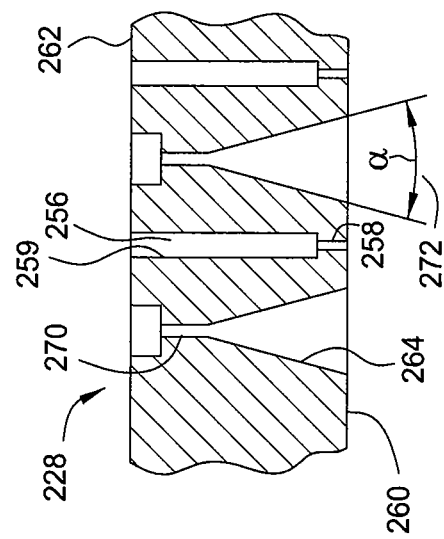
FIG. 3A is a partial sectional view of an electrode for a process lid assembly in accordance with one embodiment of the present invention.
Figure 3B:
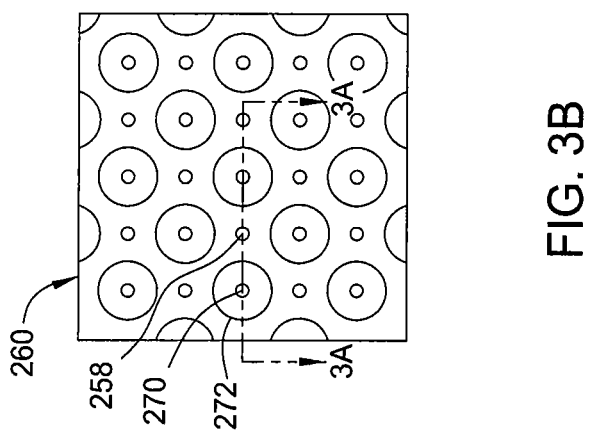
FIG. 3B is a bottom view of the electrode of FIG. 3A.

FIG. 3A is a partial sectional view of the second electrode 228 for the process lid assembly 214 in accordance with one embodiment of the present invention. FIG. 3B is a bottom view and FIG. 3C is a top view of the second electrode 228 of FIG. 3A. The second electrode 228 comprises a first surface 260 or lower surface for positioning adjacent to the plasma cavity 244 and a second surface 262 or upper surface opposing the first surface 260 with a plurality of second passages 256 for supplying one or more precursors to a process volume and a plurality of third passages 264 formed therebetween for providing one or more reactive gases a gas source to the plasma cavity 244.

In one embodiment, the plurality of third passages 264 may be evenly distributed over the second electrode 228. In one embodiment, the plurality of third passages 264 comprises a narrow bore 270 coupled to a cone-shaped channel 272 having a diameter that expands as the plurality of third passages 264 extend from the second surface 262 of the second electrode 228 to the first surface 260 of the second electrode 228. In one embodiment, the sidewalls of the cone-shaped channel 272 form an angle "α". In one embodiment, the angle "α" is between about 20° and about 30°.

In one embodiment, the plurality of second passages 256 may be evenly distributed over the second electrode 228. In one embodiment, the plurality of second passages 256 comprises a narrow bore 258 extending from the first surface 260 coupled to a straight channel 259 that extends to the second surface 262 of the second electrode 228.

In one embodiment, the second electrode 228 may be formed from a conductive material, such as metal or metal alloys. In one embodiment, the second electrode 228 is formed from a metal. Exemplary metals may be selected from the group consisting of aluminum, steel, stainless steel (e.g., iron-chromium alloys optionally containing nickel), iron, nickel, chromium, an alloy thereof, and combinations thereof. In one embodiment, the second electrode 228 is a planar disk.

Figure 4:
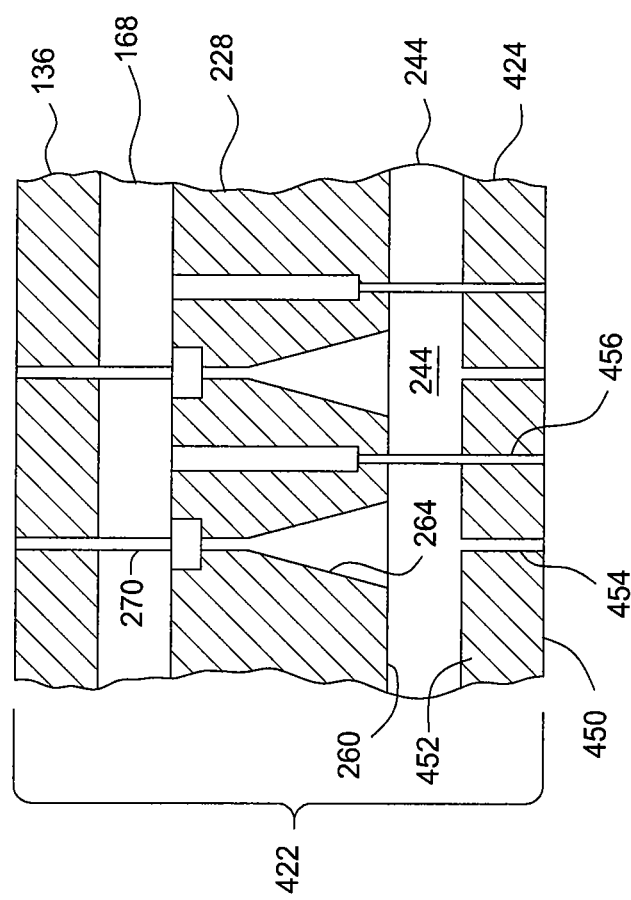
FIG. 4 is a partial sectional view of a showerhead assembly for a process lid assembly in accordance with one embodiment of the present invention.

FIG. 4 is a partial sectional view of a showerhead assembly 422 for a process lid assembly in accordance with one embodiment of the present invention. The showerhead assembly 422 is similar to showerhead assembly 222 except that the first electrode 424 has a plurality of first passages 454 that are aligned with or in the "line of sight" of the plurality of third passages 264 for delivering activated species to a process volume of a process chamber, such as process chambers 100, 200. In certain embodiments where the plurality of first passages 454 is aligned with the plurality of third passages 264 a higher volume of reactive species may be delivered to the process volume using lower power levels.

The first electrode 424 comprises a first surface 450 or lower surface adjacent to a process volume 118 and a second surface 452 or upper surface adjacent to the plasma cavity 244 with a plurality of first passages 454 formed therebetween. The plurality of first passages 454 couple the process volume 118 with the plasma cavity 244 and provide a conduit for delivering active reactant species from the plasma cavity 244 to the process volume 118. The plurality of first passages 454 may also be used to deliver other gases such as carrier gases, purge gases, and/or cleaning gases to the process chamber 100. In one embodiment, the plurality of first passages 454 are evenly distributed across a surface area of the first electrode 424 corresponding to a surface area of the substrate support 112. The first electrode 424 also has a plurality of second passages 456 coupling the process volume 118 with a second gas source for supplying one or more precursors to the process volume 118. The plurality of second passages 456 may also be used to deliver other gases such as carrier gases, purge gases, and/or cleaning gases to the process chamber 100.

In one embodiment, the first electrode 424 may be formed from a conductive material, such as metal or metal alloys. In one embodiment, the first electrode 424 is a planar disk. In one embodiment, the first electrode 424 is formed from a metal, such as aluminum, steel, stainless steel (e.g., iron-chromium alloys optionally containing nickel), iron, nickel, chromium, an alloy thereof or combinations thereof.

Each component (e.g., the first electrodes 124, 424, the insulator 132, the second electrodes 128, 228, the blocker plates 136, the water box 140, and the gas distribution assembly) may be scaled to process a substrate of varying size, such as a wafer with a 150 mm diameter, a 200 mm diameter, a 300 mm diameter, or larger. Each component may be positioned and secured on the first electrodes 124, 424 or lid plate by any securing means known in the art such as, for example, clips and/or fasteners.

Embodiments described herein provide methods for depositing a variety of material (e.g., titanium nitride) on a substrate by a vapor deposition process, such as atomic layer deposition (ALD) or plasma-enhanced ALD (PE-ALD). In one aspect, the process has little or no initiation delay and maintains a fast deposition rate while forming a titanium material, such as metallic titanium, titanium nitride, titanium silicon nitride, or derivatives thereof.

In one embodiment, titanium precursors that may be used with the PE-ALD processes described herein include tetrakis (dimethylamino)titanium (TDMAT), tetrakis(diethylamino) titanium (TDEAT), titanium tetrachloride ($TiCl_4$), and derivatives thereof. The PE-ALD processes described herein include sequentially exposing a substrate with a nitrogen precursor and a nitrogen plasma or other ionized reagent plasma.

In one embodiment, a titanium nitride material may be formed during a PE-ALD process containing a constant flow of a reagent gas while providing sequential pulses of a titanium precursor and a plasma. In another embodiment, a titanium material may be formed during another PE-ALD process that provides sequential pulses of a titanium precursor (e.g., TDMAT) and a reagent plasma (e.g., nitrogen plasma). In both of these embodiments, the reagent is generally ionized during the process. The PE-ALD process provides that the plasma is generated internally in the showerhead assembly thus reducing the distance which the plasma activated species has to travel to reach the substrate surface is dramatically reduced compared to systems using an RPS. The amount of available active species in the process volume is significantly increased and the required power to achieve an increase in available active species is concurrently reduced. During PE-ALD processes, a plasma may be generated from a microwave (MW) frequency generator, a radio frequency (RF) generator, or pulsed DC current. In another embodiment, a titanium material may be formed during a thermal ALD process that provides sequential pulses of a titanium precursor and a reagent. Both the process gas containing TDMAT and the nitrogen plasma are sequentially pulsed to and through showerhead assembly 122, 222. Thereafter, the substrate is sequentially exposed to the process gas and the nitrogen plasma.

The process lid assemblies 114 or 214 may be utilized during ALD processes described in embodiments herein and may be coupled with various ALD chamber bodies described herein. Other ALD chambers may also be used during some of the embodiments described herein and are available from Applied Materials, Inc., located in Santa Clara, Calif. A detailed description of an ALD chamber that may be used with the process lid assemblies described herein may be found in commonly assigned U.S. Pat. Nos. 6,916,398 and 6,878,206, and commonly assigned U.S. Ser. No. 10/281, 079, filed on Oct. 25, 2002, and published as US 2003-0121608, which are hereby incorporated by reference in their entirety. In another embodiment, a chamber configured to operate in both an ALD mode as well as a conventional CVD mode may be used to deposit titanium materials is described in commonly assigned U.S. Pat. No. 7,204,886, which is incorporated herein by reference in its entirety.

In some embodiments, the deposition chamber may be pressurized at a pressure within a range from about 0.01 Torr to about 80 Torr, preferably from about 0.1 Torr to about 10 Torr, and more preferably, from about 0.5 Torr to about 2 Torr during the ALD processes described herein. Also, the chamber or the substrate may be heated to a temperature of less than about 500° C., preferably, about 400° C. or less, such as within a range from about 200° C. to about 400° C., and more preferably, from about 340° C. to about 370° C., for example, about 360° C. during several of the ALD processes described herein. The plasma may be generated by a microwave (MW) generator or a radio frequency (RF) generator. For example, the plasma generator may be set to have a power output within a range from about 200 watts (W) to about 40 kilowatts (kW), preferably, from about 200 kW to about 10 kW, and more preferably, from about 500 W to about 3 kW.

In one embodiment, the substrate may be exposed to a reagent gas throughout the whole ALD cycle. The substrate may be exposed to a titanium precursor gas supplied from the second gas source 158 by passing a carrier gas (e.g., nitrogen or argon) through an ampoule of a titanium precursor. The ampoule may be heated depending on the titanium precursor used during the process. In one example, an ampoule containing TDMAT may be heated to a temperature within a range from about 25° C. to about 80° C. The titanium precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The titanium precursor gas and the reagent gas may be combined to form a deposition gas. A reagent gas usually has a flow rate within a range from about 100 sccm to about 3,000 sccm, preferably, from about 200 sccm to about 2,000 sccm, and more preferably, from about 500 sccm to about 1,500 sccm. In one example, nitrogen plasma is used as a reagent gas with a flow rate of about 1,500 sccm. The substrate may be exposed to the titanium precursor gas or the deposition gas containing the titanium precursor and the reagent gas for a time period within a range from about 0.1 seconds to about 8 seconds, preferably, from about 1 second to about 5 seconds, and more preferably, from about 2 seconds to about 4 seconds. The flow of the titanium precursor gas may be stopped once a layer of the titanium precursor is adsorbed on the substrate. The layer of the titanium precursor may be a discontinuous layer, a continuous layer, or even multiple layers.

The substrate and chamber may be exposed to a purge process after stopping the flow of the titanium precursor gas. The flow rate of the reagent gas may be maintained or adjusted from the previous step during the purge process. Preferably, the flow of the reagent gas is maintained from the previous step. Optionally, a purge gas may be administered into the deposition chamber with a flow rate within a range from about 100 sccm to about 2,000 sccm, preferably, from about 200 sccm to about 1,000 sccm, and more preferably, from about 300 sccm to about 700 sccm, for example, about 500 sccm. The purge process removes any excess titanium precursor and other contaminants within the deposition chamber. The purge process may be conducted for a time period within a range from about 0.1 seconds to about 8 Seconds, preferably, from about 1 second to about 5 seconds, and more preferably, from about 2 seconds to about 4 seconds. The carrier gas, the purge gas and the process gas may contain nitrogen, hydrogen, ammonia, argon, neon, helium or combinations thereof. In a preferred embodiment, the carrier gas contains nitrogen.

Thereafter, the flow of the reagent gas may be maintained or adjusted before igniting a plasma. During processing, a nitrogen source, such as nitrogen gas, is supplied from the first gas source 148. The nitrogen gas flows into the plasma cavity 144, where the nitrogen gas is dissociated when a plasma of the nitrogen gas is ignited by the RF power applied between the first electrode 124 and the second electrode 128.

The free nitrogen radicals (nitrogen atoms) then flow through the plurality of first passages 154 into the process volume 118.

The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power was turned off. In one example, the reagent may be ammonia, nitrogen, hydrogen or a combination thereof to form an ammonia plasma, a nitrogen plasma, a hydrogen plasma, or a combined plasma. The reactant plasma reacts with the adsorbed titanium precursor on the substrate to form a titanium material thereon. In one example, the reactant plasma is used as a reducing agent to form metallic titanium. However, a variety of reactants may be used to form titanium materials having a wide range of compositions.

The deposition chamber was exposed to a second purge process to remove excess precursors or contaminants from the previous step. The flow rate of the reagent gas may be maintained or adjusted from the previous step during the purge process. An optional purge gas may be administered into the deposition chamber with a flow rate within a range from about 100 sccm to about 2,000 sccm, preferably, from about 200 sccm to about 1,000 sccm, and more preferably, from about 300 sccm to about 700 sccm, for example, about 500 sccm. The second purge process may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the titanium material is deposited on the substrate. The titanium material may be deposited with a thickness less than 1,000 Å, preferably less than 500 Å and more preferably from about 10 Å to about 100 Å, for example, about 30 Å. The processes as described herein may deposit a titanium material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the titanium materials.

Even though metal nitride film formation is discussed with the embodiments described herein, it should be understood that other processes requiring radicals are required can also be performed using the apparatus and methods described herein.

Embodiments described herein provide the ability to generate plasma internally in the process lid assembly which reduces the distance which the plasma activated species has to travel to reach the substrate surface in the process volume of a process chamber compared to systems using an RPS. The amount of available active species in the process volume is significantly increased and the required power to achieve the increase available active species is concurrently reduced.

While the foregoing is directed to embodiments of the present invention, other and further embodiments of the invention may be devised without departing from the basic scope thereof, and the scope thereof is determined by the claims that follow.

The invention claimed is:

1. A chamber for plasma enhanced processing of one or more substrates, comprising:
 a chamber body defining a process volume;
 a substrate support disposed in the process volume and configured to support one or more substrates;
 a process lid assembly disposed over the substrate support, wherein the process lid assembly has:
  a plasma cavity configured to generate a plasma and provide one or more radical species to the process volume;
  a first electrode having:
   a first surface facing the process volume;
   a second surface opposite the first surface of the first electrode;
   a plurality of first passages extending from the first surface of the first electrode to the second surface of the first electrode and configured for delivery of the one or more radical species from the plasma cavity to the process volume; and
   a plurality of second passages extending from the first surface of the first electrode to the second surface of the first electrode and configured for delivery of a reactant gas to the process volume;
  a second electrode substantially parallel to the first electrode and having:
   a first surface facing the plasma cavity;
   a second surface opposite the first surface of the second electrode;
   a plurality of third passages extending from the first surface of the second electrode to the second surface of the second electrode and configured for delivery of a plasma forming gas to the plasma cavity;
  an insulator disposed between the first electrode and the second electrode near perimeters of the first electrode and the second electrode, wherein the plasma cavity is defined between the first electrode, the second electrode, and the insulator;
  a first gas region positioned above and fluidly coupled with the plasma cavity via the plurality of third passages, wherein the plurality of third passages are configured for delivery of the plasma forming gas from the first gas region to the plasma cavity;
  a second gas region positioned between the first gas region and the plasma cavity configured for delivery of the reactant gas to the process volume, wherein the second gas region is fluidly coupled with the process volume via the plurality of second passages; and
  a blocker plate positioned on the second electrode and having:
   a first surface;
   a second surface opposite the first surface of the blocker plate;
   a plurality of fourth passages extending from the first surface of the blocker plate to the second surface of the blocker plate;
    wherein the plurality of fourth passages are aligned with the plurality of third passages and configured for delivery of the plasma forming gas from the plurality of third passages to the plasma cavity; and
    wherein the second gas region is defined between the blocker plate and the second surface of the second electrode.

2. The chamber of claim 1, wherein the process lid assembly, further comprises:
 a water box positioned on the blocker plate, wherein the first gas region is defined between the blocker plate and the water box.

3. The chamber of claim 1, wherein each of the plurality of third passages extending from the first surface of the second electrode to the second surface of the second electrode is defined by a cone-shaped channel having an opening toward the first surface of the second electrode connected to a bore opening toward the second surface of the second electrode.

4. The chamber of claim 3, wherein the cone-shaped channel forms an angle between about 20° and about 30°.

5. The chamber of claim 1, wherein the first electrode and the second electrode are each individually formed from a metal selected from the group consisting of: aluminum, steel, stainless steel, iron, nickel, chromium, an ahoy thereof, and combinations thereof.

6. The chamber of claim 1, further comprising:
a gas inlet coupling a gas source configured for delivery of the plasma forming gas with the process lid assembly; and
a ferrite containing element positioned adjacent to the gas inlet for reducing the formation of parasitic plasma or arcing near the gas inlet.

7. A process lid assembly for providing radicals of a reactant gas to a process volume, having:
a plasma cavity configured to generate a plasma and provide one or more radical species to the process volume;
a first electrode having:
a plurality of first passages extending from a first surface of the first electrode to a second surface of the first electrode and configured for delivery of the one or more radical species from the plasma cavity to a process volume, wherein the first surface of the first electrode is adapted to face the process volume; and
a plurality of second passages extending from the first surface of the first electrode to the second surface of the first electrode and configured for delivery of a reactant gas to the process volume;
a second electrode substantially parallel to the first electrode and having a plurality of third passages extending from a first surface of the second electrode to a second surface of the second electrode, wherein the plurality of third passages are configured for delivery of a plasma forming gas to the plasma cavity, wherein the plasma cavity is defined between the first electrode and the second electrode and the first surface of the second electrode faces the plasma cavity;
a first gas region positioned above and fluidly coupled with the plasma cavity via the plurality of third passages, wherein the plurality of third passages are configured for delivery of the plasma forming gas from the first gas region to the plasma cavity;
a second gas region positioned between the first gas region and the plasma cavity configured for delivery of the reactant gas to the process volume, wherein the second gas region is fluidly coupled with the process volume via the plurality of second passages; and
a blocker plate positioned on the second electrode, wherein the second gas region is defined between the blocker plate and the second electrode, the blocker plate has a plurality of fourth passages extending from a first surface of the blocker plate to a second surface of the blocker plate, the plurality of fourth passages are aligned with the plurality of third passages, the plurality of fourth passages are configured for delivery of the plasma forming gas from the plurality of third passages to the plasma cavity.

8. The process lid assembly of claim 7, further comprising:
an insulator disposed between the first electrode and the second electrode near perimeters of the first electrode and the second electrode wherein the insulator further defines the plasma cavity.

9. The process lid assembly of claim 7, further comprising:
a water box positioned on the blocker plate, wherein the first gas region is defined between the blocker plate and the water box.

10. The process lid assembly of claim 7, wherein each of the plurality of third passages extending from the first surface of the second electrode to the second surface of the second electrode is defined by a cone-shaped channel having an opening toward the first surface of the second electrode connected to a bore opening toward the second surface of the second electrode.

11. The process lid assembly of claim 10, wherein the cone-shaped channel forms an angle between about 20° and about 30°.

12. The process lid assembly of claim 7, wherein the first electrode and the second electrode are each individually formed from a metal selected from the group consisting of: aluminum, steel, stainless steel, iron, nickel, chromium, an alloy thereof or combinations thereof.

13. The process lid assembly of claim 7, further comprising:
a gas inlet for coupling a first gas source to the plasma cavity; and
a ferrite containing element positioned adjacent to the gas inlet for reducing the formation of parasitic plasma or arcing near the gas inlet.

14. The chamber of claim 1, further comprising:
a RF (radio frequency) power source coupled to the process lid assembly;
a plasma forming gas source coupled with the process lid assembly; and
a reactant gas source coupled with the process lid assembly.

15. The chamber of claim 1, wherein the second electrode is adapted for coupling with an RF power source and the first electrode is adapted for coupling with ground.

16. The process lid assembly of claim 7, wherein the second electrode is adapted for coupling with an RF power source and the first electrode is adapted for coupling with ground.

17. The chamber of claim 1, wherein the plurality of second passages traverse the plasma cavity and extend through the first surface of the second electrode to the second surface of the second electrode.

18. The process lid assembly of claim 7, wherein the plurality of second passages traverse the plasma cavity and extend through the first surface of the second electrode to the second surface of the second electrode.

* * * * *

UNITED STATES PATENT AND TRADEMARK OFFICE
CERTIFICATE OF CORRECTION

PATENT NO. : 9,004,006 B2  
APPLICATION NO. : 13/095720  
DATED : April 14, 2015  
INVENTOR(S) : Kao et al.

Page 1 of 1

It is certified that error appears in the above-identified patent and that said Letters Patent is hereby corrected as shown below:

In the Specification:

Column 7, Line 21, please delete "190Q" and insert -- 190C -- therefor;

Column 10, Line 55, please delete "Seconds" and insert -- seconds -- therefor;

In the Claims:

Column 13, Claim 5, Line 9, please delete "ahoy" and insert -- alloy -- therefor.

Signed and Sealed this
Sixth Day of October, 2015

Michelle K. Lee
*Director of the United States Patent and Trademark Office*